United States Patent
Nakagawa et al.

(10) Patent No.: US 10,014,427 B2
(45) Date of Patent: Jul. 3, 2018

(54) SOLAR CELL MODULE

(71) Applicant: Panasonic Intellectual Property Management Co., Ltd., Osaka (JP)

(72) Inventors: Tohru Nakagawa, Shiga (JP); Michihiko Takase, Nara (JP); Masaharu Terauchi, Hyogo (JP); Shutetsu Kanayama, Osaka (JP); Youichirou Aya, Osaka (JP); Nobuhiko Hayashi, Osaka (JP); Norio Kirita, Wakayama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 67 days.

(21) Appl. No.: 15/052,494

(22) Filed: Feb. 24, 2016

(65) Prior Publication Data

US 2016/0380141 A1    Dec. 29, 2016

(30) Foreign Application Priority Data

Jun. 26, 2015   (JP) ................................ 2015-128941

(51) Int. Cl.
*H01L 31/0232* (2014.01)
*H01L 31/054* (2014.01)
*H01L 31/052* (2014.01)

(52) U.S. Cl.
CPC ........ *H01L 31/0543* (2014.12); *H01L 31/052* (2013.01); *Y02E 10/52* (2013.01)

(58) Field of Classification Search
None
See application file for complete search history.

(56) References Cited

U.S. PATENT DOCUMENTS

| | | | | |
|---|---|---|---|---|
| 2002/0148497 | A1* | 10/2002 | Sasaoka | F24J 2/067 136/243 |
| 2009/0277493 | A1* | 11/2009 | Merkle | H01L 31/048 136/246 |
| 2011/0011445 | A1 | 1/2011 | Spencer et al. | |
| 2012/0145221 | A1* | 6/2012 | Ozaki | H01L 31/048 136/246 |
| 2014/0224299 | A1* | 8/2014 | Goto | H01L 31/0524 136/246 |
| 2015/0083192 | A1* | 3/2015 | Nobori | H01L 31/052 136/246 |

FOREIGN PATENT DOCUMENTS

| | | |
|---|---|---|
| JP | 09-083006 A | 3/1997 |
| JP | 2001-099048 A | 4/2001 |
| JP | 2002-280595 A | 9/2002 |
| JP | 2008-543066 A | 11/2008 |
| JP | 2015-015336 A | 1/2015 |

* cited by examiner

*Primary Examiner* — Magali P Slawski
(74) *Attorney, Agent, or Firm* — McDermott Will & Emery LLP

(57) ABSTRACT

A solar cell module includes: a first optical system which concentrates sunlight; a power generation element which performs photoelectric conversion; a glass plate which supports the power generation element; and a second optical system which is on a light-exiting side of the first optical system and supports the glass plate. The second optical system includes a positioning portion, and a second lens on the first optical system side, and the glass plate is disposed at the positioning portion to position the power generation element at a focal point of the second lens.

6 Claims, 8 Drawing Sheets

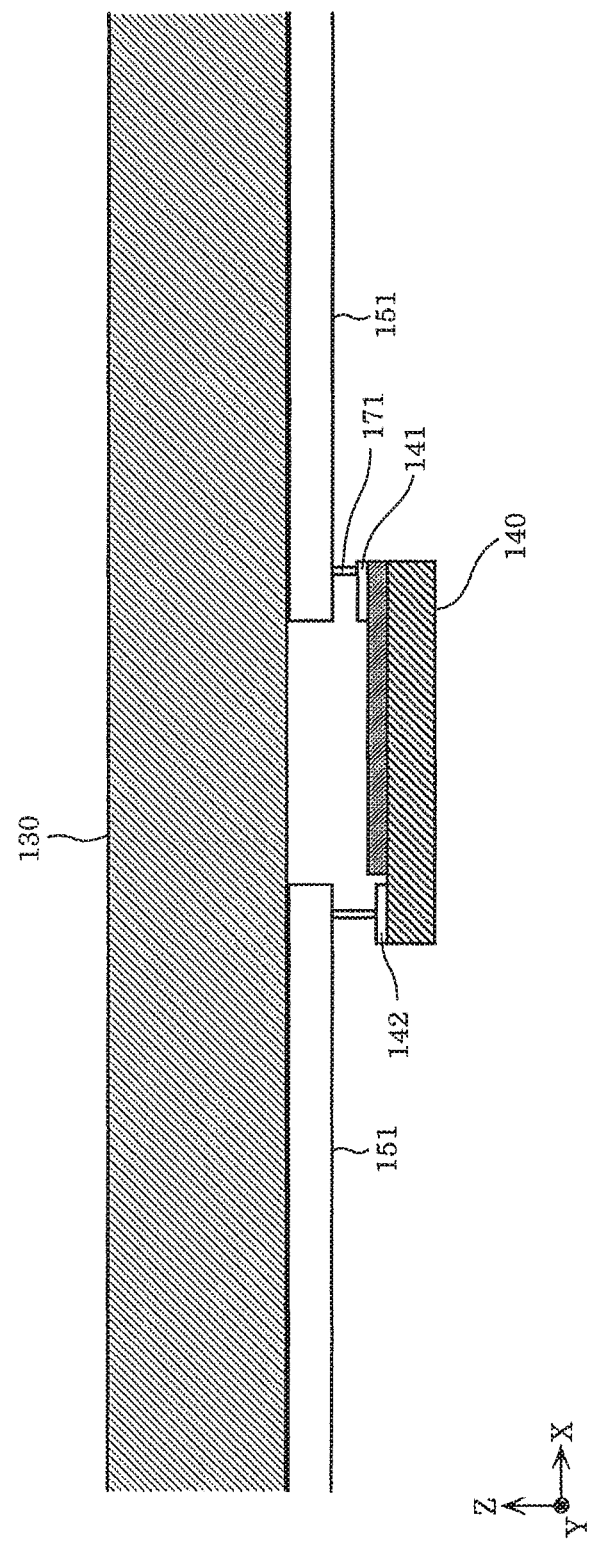

SOLAR CELL MODULE

CROSS REFERENCE TO RELATED APPLICATION

The present application is based on and claims priority of Japanese Patent Application No. 2015-128941 filed on Jun. 26, 2015. The entire disclosure of the above-identified application, including the specification, drawings and claims is incorporated herein by reference in its entirety.

BACKGROUND OF THE INVENTION

1. Field of the Invention

The present disclosure relates to a solar cell module which concentrates sunlight using a concentrator lens.

2. Description of the Related Art

Japanese Unexamined Patent Application Publication No. 2002-280595 discloses a sunlight concentrating device which has a large acceptable angle of incident sunlight. The sunlight concentrating device includes a light receiving member having a first surface which concentrates sunlight has first positive refracting power and through which light rays enter, a light guide member which is disposed next to the light receiving member and in which light rays pass, and solar cell 103 disposed directly adjoining to the light guide member. This achieves a light-concentrating device which has a large acceptable angle of incident light and includes a solar cell, that is homogenously irradiated with light.

SUMMARY OF THE INVENTION

The present disclosure provides a light-concentrating solar cell module which prevents a fall in efficiency of concentrating light.

A solar cell module according to the present disclosure includes: a first optical system which concentrates sunlight; a power generation element which performs photoelectric conversion; a holding member which holds the power generation element; and a second optical system which is on a light-exiting side of the first optical system and supports the holding member. The second optical system includes a positioning portion, and a second lens on a side of the first optical system, and the holding member is disposed at the positioning portion to position the power generation element at a focal point of the second lens.

According to the solar cell module of the present disclosure, a fall in efficiency of concentrating light is prevented.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 8 is a cross-sectional view of an enlarged portion of a solar cell module according to another embodiment.

DETAILED DESCRIPTION OF THE PREFERRED EMBODIMENTS

The following describes in detail embodiments with reference to the drawings as appropriate. However, an excessively detailed description may be omitted. For example, a detailed description of a matter already known well and a redundant description of substantially the same configuration may be omitted. This is intended to avoid making the following description unnecessarily redundant and to facilitate understanding of persons skilled in the art.

Note that the accompanying drawings and the following description are provided in order to help persons skilled in the art to sufficiently understand the present disclosure, and thus are not intended to limit the disclosed subject matter of the claims by the drawings and the description.

Embodiment 1

Figure 1:
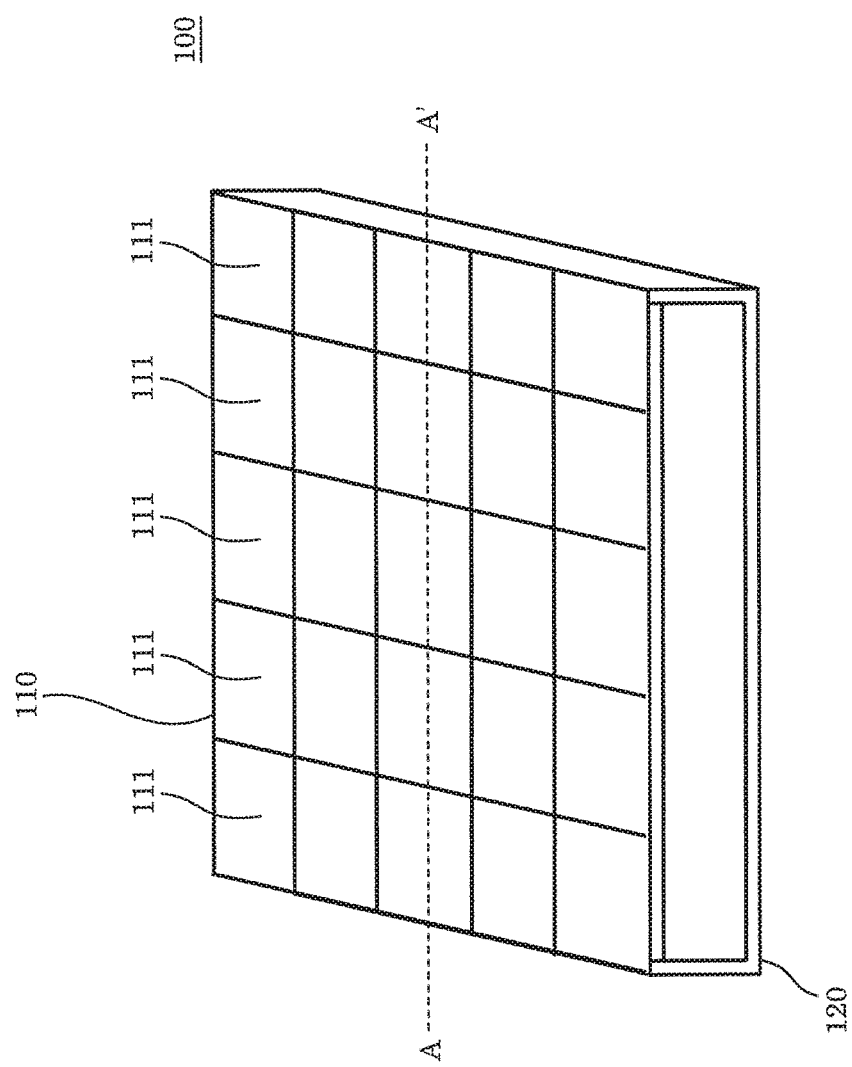
FIG. 1 is a perspective view of a solar cell module according to Embodiment 1.
Figure 2:
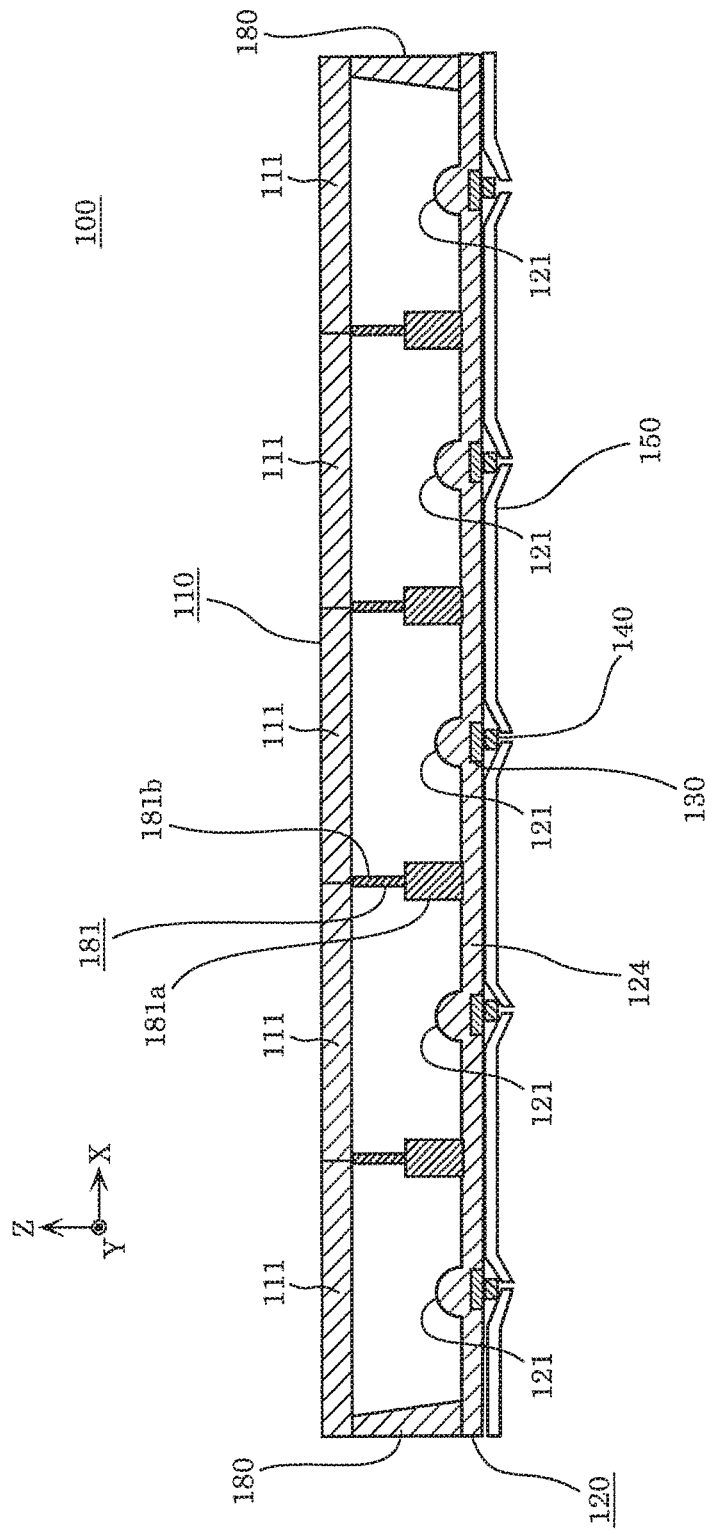
FIG. 2 is a cross-sectional view illustrating a configuration of the solar cell module according to Embodiment 1.
Figure 3:
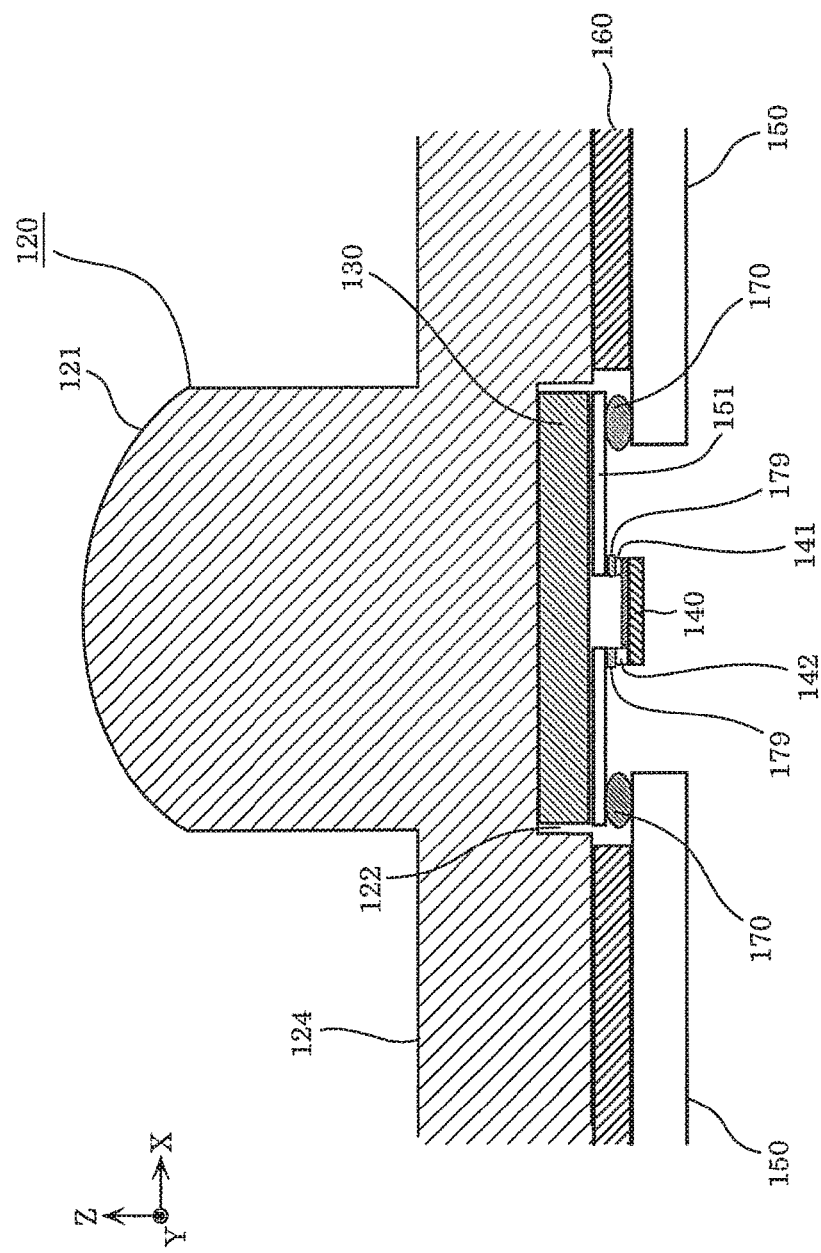
FIG. 3 is a cross-sectional view of an enlarged portion of the solar cell module according to Embodiment 1.

The following describes Embodiment 1 with reference to FIGS. 1 to 3.

1-1. Configuration

FIG. 1 is a schematic diagram of solar cell module 100 according to the present disclosure. Solar cell module 100 is a light-concentrating solar cell module which concentrates sunlight using an optical system. In addition, solar cell module 100 may be included in a device (not illustrated) which tracks sunlight. Furthermore, plural solar cell modules 100 may be arranged and included in a device which tracks sunlight. Such a device which tracks sunlight allows solar cell module 100 to receive, much of the daytime, sunlight which perpendicularly falls on the surface. FIG. 2 schematically illustrates a cross section taken along A-A in FIG. 1. Solar cell module 100 includes first optical system 110, second optical system 120, glass plates 130 each serving as a holding member, power generation elements 140, and first electrodes 150.

First optical system 110 includes an array of plural first lenses 111 having positive refracting power. First lens 111 concentrates sunlight onto second lens 121 described below. A spherical lens, an aspheric lens, or a Fresnel lens can be used for first lens 111, for example. If first lens 111 is a Fresnel lens, first lens 111 may have a Fresnel surface on a light-exiting side. The material of first optical system 110 may be resin. This is because resin contributes to a reduction in weight of solar cell module 100. Specifically, first optical system 110 is molded by extruding or injecting acrylic resin. The shapes of a light-entering surface and a light-exiting surface of first lens 111 according to the present embodiment are not particularly limited, and may be any of a square, a rectangle, and a hexagon, for example. In particular, a square shape may be adopted. Furthermore, the thickness of first lens 111 may be 5 mm or less when the readiness for molding the lens is taken into consideration.

Second optical system 120 is disposed in a position toward which light which has exited through first optical system 110 travels. Furthermore, second optical system 120 includes base portion 124 serving as a support substrate which extends along the X-Y plane in FIG. 2, and second lenses 121 on the light-entering side of base portion 124. The optical axis of second lens 121 matches the optical axis of first lens 111. Specifically, base portion 124 has a plate-like shape, and second lenses 121 are disposed on the surface of base portion 124 in an array, in one to one correspondence with first lenses 111 of first optical system 110. Base portion 124 and second lenses 121 are integrally formed.

The following describes a power generation module which includes power generation element 140 which performs photoelectric conversion, and a holding member which holds power generation element 140. Note that the present embodiment gives a description assuming that glass plate 130 serves as the holding member. Nevertheless, the material and the shape of the holding member are not particularly limited, and the holding member may be formed of transparent resin or a transparent crystal.

Power generation element 140 disposed on glass plate 130 may be positioned at the focal point of second lens 121 when glass plate 130 is placed in recess 122 which is a positioning portion provided in base portion 124 of second optical system 120. In the present embodiment, second optical system 120 has recess 122 such that power generation element 140 is positioned at the focal point of second lens 121 via glass plate 130. Glass plate 130 on which power generation element 140 is fixed is placed in recess 122 without space, and thus the positional relationship between glass plate 130 and the focal point of second lens 121 is determined. Accordingly, the position of power generation element 140 on glass plate 130 is determined by the positional relationship between the focal point of second lens 121 and recess 122. In this manner, power generation element 140 can be disposed at the focal point of second lens 121 by simply placing glass plate 130 in recess 122 of second optical system 120, thus shortening the manufacturing process.

Glass plate 130 is fixed in recess 122 with silicone resin adhesive. The area of power generation element 140 for receiving light may be 0.09 mm$^2$ to 1 mm$^2$, or more specifically 0.36 mm$^2$ to 0.64 mm$^2$. The material of second optical system 120 may be resin, as with first optical system 110. Specifically, second optical system 120 is molded by extruding or injecting acrylic resin, for example. The minimum thickness of second optical system 120 is not particularly limited, yet may be 5 mm or less when the readiness for injection molding is taken into consideration.

Glass plate 130 needs to be in a size which can fit within recess 122. Glass plate 130 has a plate-like or cuboid shape, for example. If glass plate 130 has a cuboid shape, the length of one side of a surface on which power generation element 140 is disposed may be 1 mm to 5 mm, and the thickness may be 1 mm to 5 mm.

Outer frame 180 and support members 181 are disposed between first optical system 110 and second optical system 120. Support members 181 support first optical system 110 relative to second optical system 120, and maintain a space between first optical system 110 and second optical system 120. In the present embodiment, outer frame 180 and support members 181 are all formed, integrally with second optical system 120. Support member 181 includes support portion 181a and tip portion 181b. Outer frame 180 and tip portions 181b of support members 181 all support first optical system 110, being in contact with the light-exiting surface of first optical system 110. The portion of tip portion 181b in contact with first optical system 110 has a substantially spherical shape, for example. The width (thickness) of tip portion 181b on the first optical system 110 side is narrower (thinner) than the width (thickness) of support member 181a. This prevents support members 181 from interfering sunlight exiting from first lenses 111.

First electrodes 150 for extracting photoelectric current generated in power generation elements 140 to an external circuit (not illustrated) are formed on the light-exiting side of second optical system 120. For example, Cu foil, Al foil, or Ni foil can be used for first electrodes 150. First electrodes 150 may each have an oblong shape. If first electrodes 150 have an oblong shape, the thickness may be 1 μm to 200 μm, or more specifically, 5 μm to 50 μm, and the width may be 0.05 mm to 5 mm, or more specifically, 0.5 mm to 2 mm.

The area of first lens 111 may be 100 times to 1000 times of the area of power generation element 140, or more specifically, 500 times to 1000 times. The area of power generation element 140 may be 0.09 mm$^2$ to 1 mm$^2$, or more specifically, 0.36 mm$^2$ to 0.64 mm$^2$. Accordingly, the area of first lens 111 may be 9 mm$^2$ to 1000 mm$^2$, or more specifically, 180 mm$^2$ to 640 mm$^2$.

The thickness of solar cell module 100 is determined, according to the focal length of first lens 111. The focal length of first lens 111 is about 1.5 times the diameter of the circumscribed, circle of first lens 111. Accordingly, the thickness of solar cell module 100 according to the present embodiment is about 4.5 mm to 50 mm.

FIG. 3 is a cross-sectional view of an enlarged portion of second optical system 120. Second electrodes 151 are formed on glass plate 130. First pad electrode 141 and second pad electrode 142 are formed on power generation element 140. First pad electrode 141 and second pad electrode 142 are electrodes for extracting photoelectric current generated in power generation element 140 to the outside. Power generation element 140 has the function of transforming the energy of emitted sunlight into electrical energy. Power generation element 140 includes a thin film formed of GaAs based material, GaN based material, or Si based material. Photoelectric current is generated by irradiating such a thin film with light, thus supplying electrical energy to the external circuit. A film made of GaAs based material whose energy conversion efficiency is 40% or more may be used for power generation element 140.

Second electrodes 151 are formed on glass plate 130 on which power generation element 140 is disposed. Second electrodes 151 are formed by print processes, using an Ag or Cu paste, for example. Second electrodes 151 are electrically connected to power generation element 140 via first pad electrode 141 and second pad electrode 142. Soldering paste 179 is used for connecting second electrodes 151 to first pad electrode 141 and second pad electrode 142. A mixture of organic material and an alloy such as SnCu, SnCuAg, SnBi, SnIn, or SnInAgBi is used for soldering paste 179. Note that a paste which contains silver may be used instead of soldering paste 179.

First electrodes 150 are fixed to the light-exiting side of second optical system 120 by adhesive 160. First electrodes 150 and second electrodes 151 are electrically connected by soldering paste 170, for example. A paste which contains silver may be used instead of soldering paste 170.

1-2. Advantageous Effects and Others

As described above, solar cell module 100 according to Embodiment 1 includes first optical system 110 which concentrates sunlight, glass plates 130, power generation elements 140 disposed on glass plates 130, and second optical system 120 which is disposed on the light-exiting side of first optical system 110 and supports glass plates 130. Second optical system 120 has recesses 122, second lenses 121 are provided on a side of second optical system 120 which faces first optical system 110, and glass plates 130 are disposed in recesses 122 to position power generation elements 140 at the focal point of second lenses 121. Accordingly, power generation elements 140 are accurately and readily disposed at the focal point of second lenses 121 by placing glass plates 130 in recesses 122 of second optical system 120. Accordingly, a reduction in the manufacturing cost of solar cell module 100 can be achieved by simply placing glass plates 130 using an inexpensive device having a simple mechanism.

Note that although space seems to be present between recess 122 and glass plate 130 in the illustration of FIG. 3, the inner surfaces of recess 122 and the outer surfaces of glass plate 130 are in contact with one another in at least three portions along the XY plane. The position of glass plate 130 relative to recess 122 is determined by placing glass plate 130 in recess 122.

Glass plate 130 having a thermal expansion coefficient close to the thermal expansion coefficient of power generation element 140 is provided near power generation element 140 which is irradiated with sunlight concentrated by first optical system 110 and second optical system 120 and having a high energy density, thus preventing a fall in mechanical property of a region where power generation element 140 is disposed. Also, an optical property of glass plate 130 exhibits little aged deterioration. This allows solar cell module 100 to stably generate electricity for a long period of time.

First electrodes 150 are disposed via adhesive 160 on the light-exiting side of second optical system 120. The coefficient of linear expansion of second optical system 120 is about 70 ppm/° C., whereas the coefficient of linear expansion of, for example, copper is about 16 ppm/° C., and thus the coefficients of linear expansion of those are greatly different. Accordingly, if first electrodes 150 are formed in second optical system 120 by the vacuum deposition method or the plating method, first electrodes 150 are firmly stuck and fixed to second optical system 120. Thus, if the temperature of solar cell module 100 changes, a dynamic stress is generated at interfaces between second optical system 120 and first electrodes 150, which may cause first electrode 150 to come apart from a lens. However, in the present embodiment, first electrodes 150 are fixed to second optical system 120 with adhesive 160, and thus adhesive 160 deforms and release the stress even if the temperature changes and a dynamic stress is generated at interfaces between second optical system 120 and first electrodes 150. Solar cell module 100 according to the present embodiment thus inhibits deterioration of the structure even the temperature changes.

Furthermore, a power generation module which includes glass plate 130, power generation element 140, second electrodes 151, first pad electrode 141, and second pad electrode 142 is manufactured in a process different from those for first optical system 110 and second optical system 120. Accordingly, the power generation module can be processed at a relatively high temperature, and second electrodes 151 and the power generation element can be firmly connected mechanically and electrically, via first pad electrode 141 and second pad electrode 142.

Embodiment 2

Figure 4:
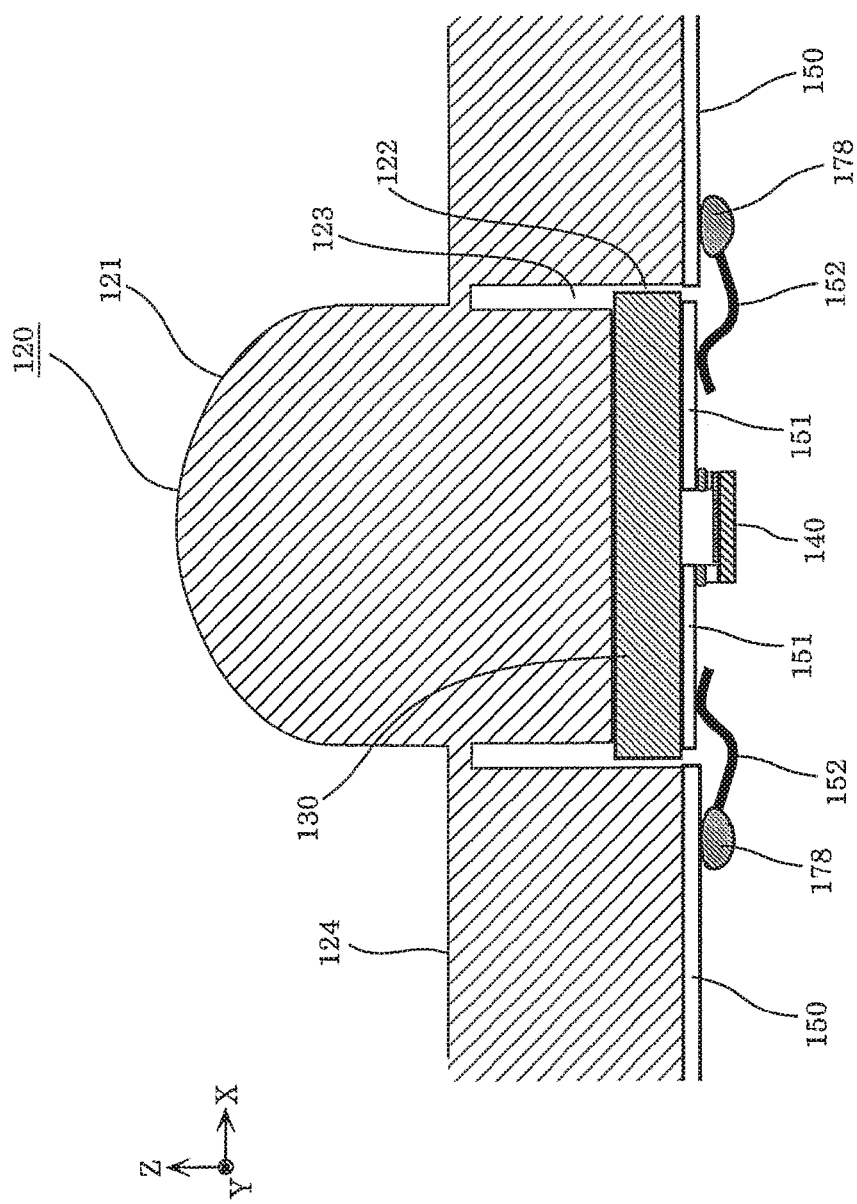
FIG. 4 is a cross-sectional view of an enlarged portion of a solar cell module according to Embodiment 2.

The following describes solar cell module 100 according to Embodiment 2 with reference to FIG. 4. A description is given focusing on differences from Embodiment 1, and a description of the other points which are the same as those in Embodiment 1 is thus omitted.

2-1. Configuration

FIG. 4 is an enlarged view of a portion of a cross section of second optical system 120 according to Embodiment 2. In solar cell module 100 according to the present embodiment, cuts 123 extending in the thickness direction of base portion 124 are formed in base portion 124 which is a portion of second optical system 120. Cuts 123 are formed so as to surround glass plate 130. In the present embodiment, cuts 123 form a tube-like space that communicates with recess 122, and extends from recess 122 toward the light-entering side of second optical system 120 while a portion of base portion 124 on the light-entering side is slightly left.

Furthermore, solar cell module 100 includes spring members 152 fixed to first electrodes 150 provided on the surface of base portion 124 and protruding inwardly of recess 122. In the present embodiment, spring members 152 are formed of conductive material such as, for example, metal, and fixed to first electrodes 150 by soldering paste 178. The biasing force of spring members 152 brings second electrodes 151 and spring members 152 into contact with one another so that electrical connection is established between second electrodes 151 and spring members 152, thus first electrodes 150 and second electrodes 151 are electrically connected to one another by spring members 152. Furthermore, spring members 152 generate force which maintains glass plate 130 in recess 122 in a direction (positive direction of the Z axis) toward the light-entering side. Specifically, glass plate 130 is fixed to recess 122 by elastic force of spring members 152, without using an adhesive.

2-2. Advantageous Effects and Others

According to solar cell module 100 according to the present embodiment, if some of power generation elements 140 of solar cell module 100 are damaged, such damaged power generation elements 140 can be each readily removed together with the whole power generation module. Specifically, since second optical system 120 has cuts 123, pressure applied to glass plate 130 which is harder than resin breaks the slightly remaining portion of base portion 124, thus removing power generation element 140 together with second lens 121. Note that glass plate 130 may be fixed to recess 122 with adhesive, in this case.

According to this, for example, when power generation elements 140 are all connected in parallel within solar cell module 100, if one power generation element short-circuits, all the power generation elements in the solar cell module cannot generate power. However, in the present embodiment, only one power generation element 140 can be removed, and thus the portion from which the power generation element is removed is open, which avoids exerting influence on other power generation elements.

Furthermore, if glass plate 130 is elastically fixed to recess 122 by spring members 152 without using an adhesive, glass plate 130 and power generation element 140, or in other words, a power generation module can also be removed from second optical system 120. Furthermore, glass plate 130 on which damaged power generation element 140 is disposed is removed, and the glass plate may be exchanged for glass plate 130 on which power generation element 140 not damaged is disposed. Specifically, this allows exchange of power generation modules, and maintains the power generating capacity of solar cell module 100.

Furthermore, if glass plate 130 is fixed to recess 122 by the biasing force of spring members 152, glass plate 130 can be prevented from coming apart from recess 122 due to the following incident in which a change in temperature of solar cell module 100, for instance, causes linear expansion of glass plate 130 and linear expansion of second optical system 120, but the amounts of the linear expansions are different, thus breaking the adhered portion.

Embodiment 3

Figure 5A:
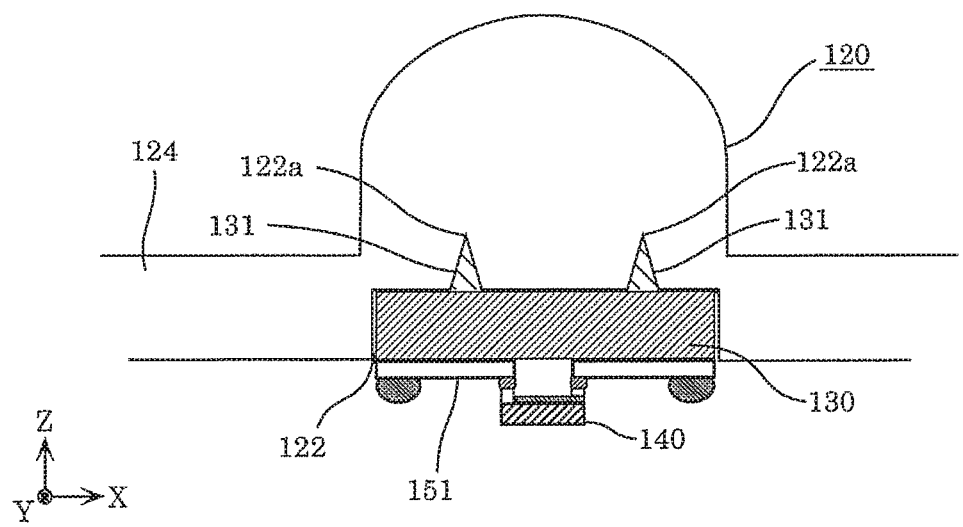
FIG. 5A is a cross-sectional view of an enlarged portion of a solar cell module according to Embodiment 3.
Figure 5B:
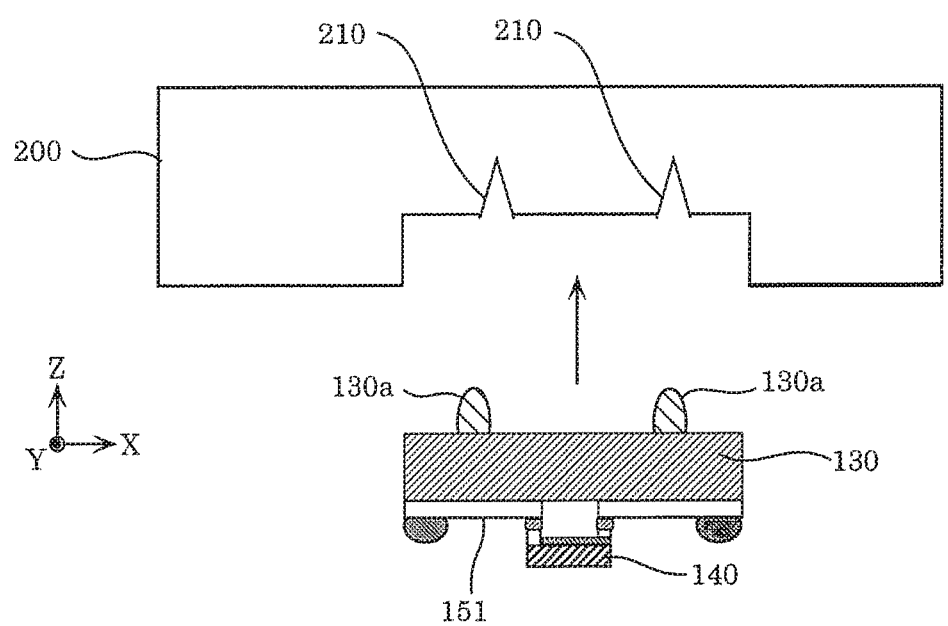
FIG. 5B is a cross-sectional view illustrating a method for forming protrusions according to Embodiment 3.

The following describes solar cell module 100 according to Embodiment 3 with reference to FIGS. 5A and 5B. The description is given mainly focusing on differences from Embodiment 1, and a description of the other points which are the same as those in Embodiment 1 is thus omitted.

3-1. Configuration

FIG. 5A is an enlarged view of a portion of second optical system 120 according to Embodiment 3. Note that FIG. 5A also illustrates the cross section of second optical system 120, but is not hatched to facilitate a description. Protrusions 131 serving as engagement portions are formed on glass plate 130 of solar cell module 100 according to the present embodiment. Furthermore, second recesses 122a serving as second positioning portions are formed in the portion of second optical system 120 above recess 122. The structure of protrusions 131 allows protrusions 131 to fit into second recesses 122a. Protrusions 131 are provided on an outer side than the optical path along which light enters second lens 121 toward power generation element 140.

Here, a description of a method for forming protrusions 131 on glass plate 130 is given. FIG. 5B schematically illustrates a cross section showing a method for forming protrusions 131 on glass plate 130.

First, mold 200 which has depressions 210 having the same shape as second recesses 122a is prepared to form protrusions 131.

Next, ceramic paste 130a is applied to form mountains on the surface of glass plate 130 opposite the surface on which power generation element 140 is disposed. Ceramic paste 130a can be deformed freely at room temperature.

Next, such glass plate 130 is put into mold 200. In this manner, ceramic paste 130a is buried in depressions 210 of mold 200, and formed into the same shape as protrusions 131.

Next, glass plate 130 on which ceramic paste 130a is formed into the same shape as protrusions 131 is baked, thus solidifying ceramic paste 130a. Accordingly, protrusions 131 are formed on glass plate 130.

In solar cell module 100 according to the present embodiment, if glass plate 130 on which protrusions 131 are formed is placed in recess 122 of second optical system 120, protrusions 131 and second recesses 122a of second optical system 120 fit with one another, which makes alignment easy.

Note that the positional relationship between power generation element 140 and protrusions 131 on glass plate 130 is predetermined. Accordingly, power generation element 140 is positioned at the focal point of second lens 121 when protrusions 131 on glass fit into second recesses 122a of second optical system 120. In this manner, power generation element 140 can be disposed at the focal point of second lens 121 more accurately by fitting protrusions 131 and second recesses 122a with one another than by placing glass plate 130 in recess 122 of second optical system 120.

Note that protrusions 131 may be formed on glass plate 130 first, and thereafter, second electrodes 151 may be formed and power generation element 140 may be disposed, using protrusions 131 as references.

3-2. Advantageous Effects and Others

In a light-concentrating solar cell which includes, for instance, a lens, the power generating efficiency of solar cell module 100 will fall, unless power generation element 140 is accurately disposed at the focal point of second lens 121. Thus, it is necessary to accurately dispose glass plate 130 in recess 122 of second optical system 120 to position power generation element 140 at the focal point of second lens 121.

In the present embodiment, protrusions 131 on glass plate 130 and second recesses 122a of second optical system 120 fit with one another, and thus power generation element 140 is disposed so as to be positioned at the focal point of second lens 121. Accordingly, power generation element 140 can be accurately disposed at the focal position using an inexpensive device, and as a result, the manufacturing cost of a solar cell module decreases.

Other Embodiments

The above has described Embodiments 1 to 3 as examples of a technique disclosed in this application. However, the technique according to the present disclosure is not limited to the examples, and is also applicable to embodiments in which various configurations are changed, replaced, added, and omitted, for instance. Furthermore, new embodiments may be achieved by combining constituent elements described in Embodiments 1 to 3 above.

Now, the following describes an example of another embodiment.

Figure 6:
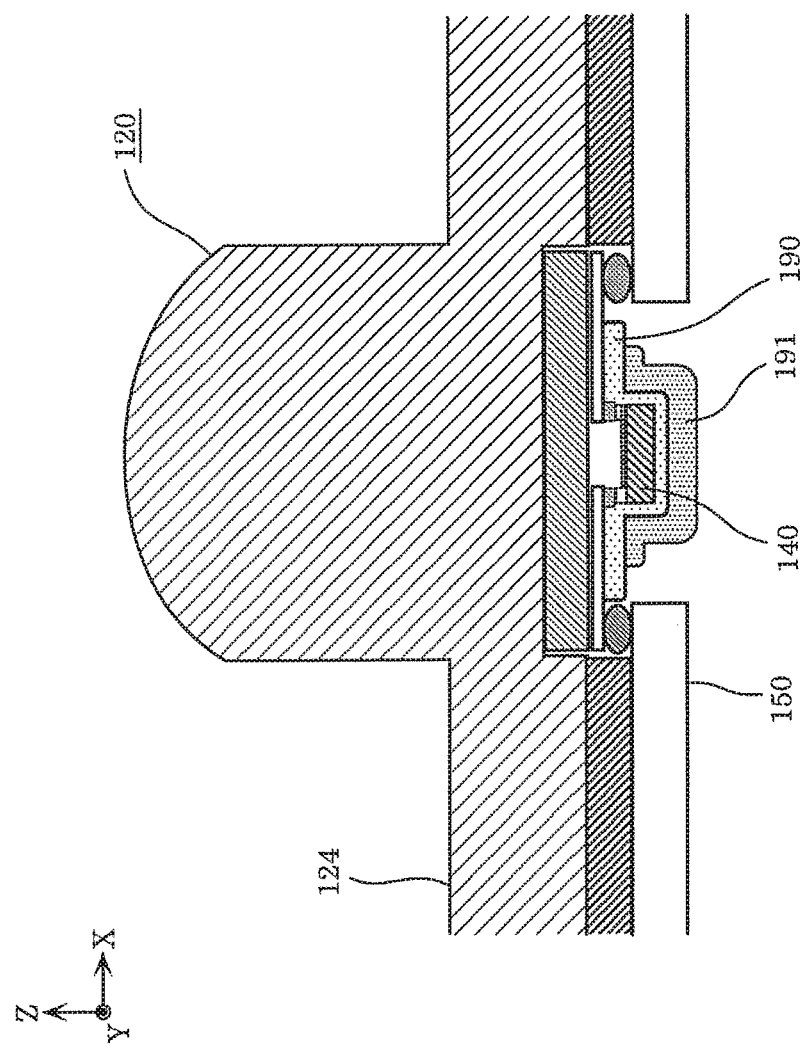
FIG. 6 is a cross-sectional view of an enlarged portion of a solar cell module according to another embodiment.

FIG. 6 is an enlarged view of a portion of second optical system 120 according to another embodiment. In solar cell module 100, electrically insulating resin 190 covers the back surfaces of power generation element 140, or namely, on the surfaces excluding the light receiving surface of power generation element 140, and heat dissipation paste 191 which contains silver is, for example, applied onto resin 190 so as to cover resin 190. The other configuration is the same as that of Embodiment 1.

Heat dissipation paste 191 covers the surface of electrically insulating resin 190, except for the edge portions. This prevents heat dissipation paste 191 which is electrically conductive from coming into contact with first electrodes 150 and being short-circuited. Furthermore, after being applied onto insulating resin 190, heat dissipation paste 191 may be dried rapidly, and the surface may be made rough. This increases the surface area of heat dissipation paste 191, thus efficiently releasing heat inside heat dissipation paste 191 to the outside. Heat dissipation paste 191 may be material having high thermal conductivity, and material such as a paste containing silver or aluminum, silicone resin, or grease may be used. Examples of insulating resin 190 include polyimide resin, silicone resin, acrylic resin, and epoxy resin all of which contain dispersed metal particles. In this manner, heat generated in power generation element 140 can be efficiently dissipated to the outside. The thickness of electrically insulating resin 190 is 0.01 mm to 5 mm, or more specifically, 0.1 mm to 1 mm.

Heat dissipation paste 191 covers the back surfaces of power generation element 140 via electrically insulating resin 190, and thus heat generated in power generation element 140 can be dispersed into heat dissipation paste 191. This prevents a rise in temperature of power generation element 140, and a fall in power generating efficiency due to the rise in temperature of power generation element 140.

Figure 7A:
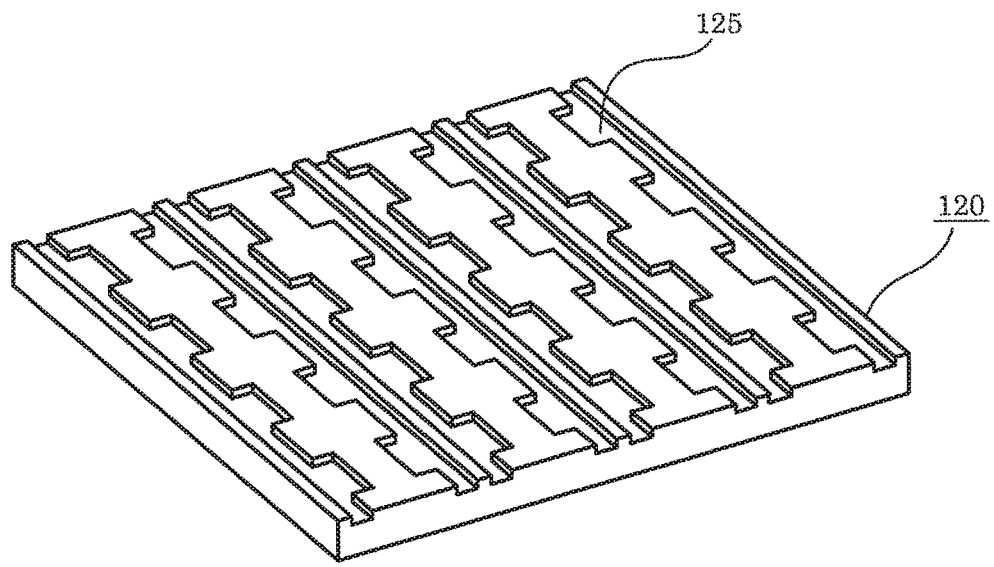
FIG. 7A is a perspective view illustrating a configuration of a second optical system according to another embodiment.
Figure 7B:
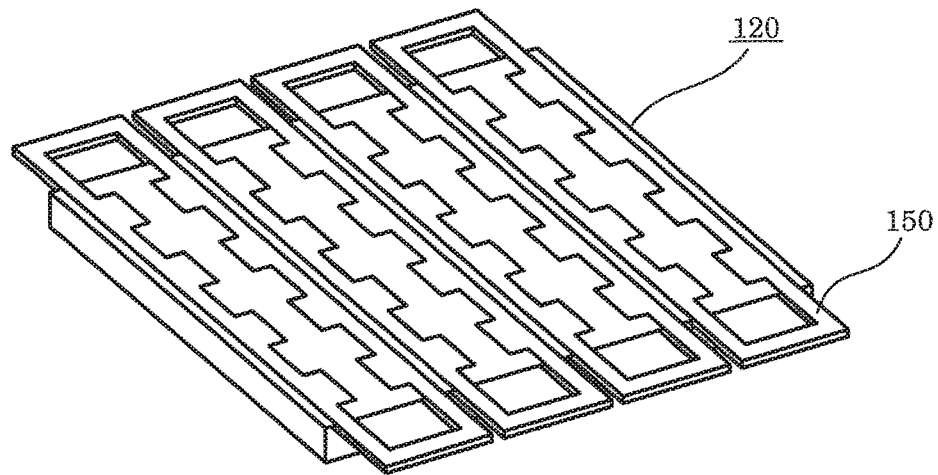
FIG. 7B is a perspective view illustrating a configuration of the second optical system according to the other embodiment.

FIG. 7A is a perspective view illustrating a surface of second optical system 120 opposite the light receiving surface, according to another embodiment. FIG. 7B is a perspective view illustrating second optical system 120 on which first electrodes 150 are disposed according to the other embodiment. FIG. 7A illustrates that grooves 125 whose width is periodically different are formed in the back side of base portion 124 of second optical system 120. Grooves 125 may have a width of 1 mm to 5 mm and a depth of 0.1 mm to 1 mm. As illustrated in FIG. 7B, first electrodes 150 whose shape and depth match those of grooves 125 are disposed in grooves 125. First electrodes 150 can be produced by punching or etching a copper, nickel, or aluminum roiled plate. First electrodes 150 are disposed in grooves 125 using adhesive 160 as with Embodiment 1.

Grooves 125 whose width is periodically different are formed in advance in second optical system 120, thus accurately disposing first electrodes 150 on the back surface of second optical system 120, simply by first electrodes 150 mechanically fitting in the grooves. Accordingly, since first electrodes 150 can be formed using a simple device, and thus a reduction in the manufacturing cost of solar cell module 100 is achieved.

The following describes solar cell module 100 according to another embodiment, with reference to FIG. 8. In Embodiment 1, soldering paste is used for connecting second electrodes 151 to first pad electrode 141 and second pad electrode 142. However, the method to connect the electrodes is not limited to this. As illustrated in FIG. 8, copper thin lines 171 are provided on first pad electrode 141 and second pad electrode 142 of power generation element 140, thus connecting the electrodes to second electrodes 151. Thin lines 171 are nanowires having a diameter of about 100 μm. Known photo sintering is performed on the lines, thus connecting the lines to second electrodes 151. In this manner, power generation element 140 can be connected more accurately than by soldering. Note that the material of thin lines 171 may be the same material of second electrodes 151 connected to the lines. The material is not limited to copper, and may be gold or silver.

This allows power generation element 140 to be disposed in a more accurate position relative to glass plate 130, and power generation element 140 to be accurately positioned at the focal point of second lens 121 via glass plate 130.

Note that the embodiments described above show examples of a technique according to the present disclosure, and thus various changes, replacement, addition, and omission, for example, can be made to the embodiments within the scope of claims and its equivalent range.

For example, the positioning portions may be, for example, pins set on the back surface of base portion 124, rather than recesses 122.

Furthermore, the meaning of "on" in this specification includes both "direct contact" and "indirect contact".

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a light-concentrating solar cell device.

What is claimed is:

1. A solar cell module comprising: a first optical system which concentrates sunlight; a power generation element which performs photoelectric conversion; a holding member which holds the power generation element; a support substrate which is on a light-exiting side of the first optical system and supports the holding member, a first electrode on the support substrate; a connection electrode fixed to the first electrode; and a second electrode on the holding member; wherein the first optical system, the support substrate, the holding member and the power generation element are disposed in this order in a direction in which the sunlight is concentrated, the support substrate includes a positioning portion, and a light-concentrating portion on a surface of the support substrate facing side-of the first optical system, the holding member is disposed at the positioning portion to position the power generation element at a focal point of the light-concentrating portion, and the connection electrode applies pressure to the holding member.

2. The solar cell module according to claim 1, wherein the positioning portion is a recess in the support substrate.

3. The solar cell module according to claim 1, wherein the support substrate includes a support portion which supports the first optical system.

4. The solar cell module according to claim 1, further comprising:
an electrically insulating resin which dissipates heat; and
a heat dissipation paste, wherein
the electrically insulating resin covers a lateral surface of the power generation element and a surface of the power generation element on a side opposite the holding member, and
the heat dissipation paste covers a surface of the electrically insulating resin except for an edge portion of the surface.

5. The solar cell module according to claim 1, wherein
the positioning portion includes a second positioning portion,
the holding member includes an engagement portion on a side opposite a side where the power generation element is disposed, and
the second positioning portion and the engagement portion fit with one another.

6. The solar cell module according to claim 1, wherein the power generation element and an electrode on a surface of the holding member are connected to one another by a conductive line.

* * * * *